DOUBLE TIME-CONSTANT AGC FOR SPEECH AMPLIFIER

Filed Dec. 14, 1959

INVENTOR
JORGEN L. NIELSEN
by [signature]
ATTORNEY 3,021,489

DOUBLE TIME-CONSTANT AGC FOR SPEECH AMPLIFIER

Jorgen Louis Nielsen, Rochester, N.Y., assignor to General Dynamics Corporation, Rochester, N.Y., a corporation of Delaware Filed Dec. 14, 1959, Ser. No. 859,391
7 Claims. (Cl. 330—29)

The present invention relates generally to a new and improved automatic gain control circuit and is particularly concerned with a circuit of this type for controlling the gain of a speech amplifier used in radio transmitting equipment and utilizing junction transistors.

The transmission of human speech gives rise to a number of problems directly concerned with the inherent characteristics of the speech signals. Thus, for example, the very high peak-to-average ratio of speech signals makes it difficult to obtain optimum use of the available transmitter power since the peaks cannot be permitted to exceed the capabilities of the transmitter. In high efficiency communications equipment, it is, therefore, desirable to employ some means of speech processing to minimize the effects of the peak power signals without, at the same time, materially impairing the quality or naturalness of the voice transmission.

Among the proposed solutions to the problem is the use of gain control circuits known as compressors in the audio amplification stages of the transmitter. Such a compressor is actually an amplifier having its gain automatically varied in response to a change in input level so that the gain is reduced for peak signals. However, these compressors are subject to distortion due to the fact that, since they operate from the signal envelope and have very short time constants, the gain control signal contains distortion components having frequencies falling within the audio range which components enter the signal paths of the transmitter where they appear as popping sounds accompanied by signal distortion. Furthermore, due to the insufficient frequency separation between the speech signal and the control signal, regeneration is often an acute problem with the result that the dynamic range of transmitters using compressors is generally very limited. Moreover, due to the very short time constants of the control circuit, the gain is reduced and increased at a syllabic rate, thus giving rise to frequent bursts which overload the transmitter and/or necessitates operation at a lower average level of drive. The ideal automatic gain control circuit would provide signals having very fast attack time for the high level signals but, at the same time, having a slow release time in order to avoid or minimize the bursts.

A second well known circuit for minimizing the effects of the peak signals is a clipper which cuts off the positive and negative peaks beyond predetermined upper and lower limits. The clipping action is, of course, accompanied by distortion in an amount dependent upon the degree of clipping. While this distortion can be reduced by various techniques such as by use of a low pass filter to eliminate higher order harmonics of most frequencies in the pass band, it cannot be completely eliminated and, hence, it may impair the quality of the speech transmission.

It is an object of the present invention to provide a new and improved circuit for automatically controlling the gain of a speech amplifier without, at the same time, increasing the distortion.

A further object of the invention resides in the provision of an automatic gain control circuit characterized by a fast attack time and a slow release time.

Another object of the invention is to provide an automatic gain control circuit for developing a D.C. control signal having a fast attack time and a slow release time without adversely affecting the temperature stability of the circuit.

The invention has for a further object the provision of an automatic gain control circuit of the character described above which employs junction type transistors in order to realize all of the well known advantages of the latter devices.

The foregoing and other objects are achieved, in accordance with the present invention, by providing a speech amplifier having its gain automatically controlled by a circuit having time constants larger than those of compressor amplifiers referred to above. Thus, the gain of the speech amplifier in the present invention is controlled by the average speech signal rather than by the speech envelope and, as a consequence, the output signal has a substantially constant mean level regardless of the input signal but, at the same time, the output possesses the same peak-to-average ratio as the input signal. Thus, the speech amplifier accommodates both soft spoken and loud voiced operation without serious distortion by retaining the quality or naturalness of the input regardless of its strength. To this end, the AGC loop includes a detector-amplifier followed by two gated stages for providing widely different time constants for the attack and release of the gain control signal. The attack time constant is very fast to provide a quick reduction in gain for the high level input speech signals while the release time constant is slow, thus preventing the gain from popping back up again as soon as a peak has passed and, hence, avoiding frequent bursts. This provides for regulation of the gain in accordance with the mean level of the input signal, but still provides rapid gain reduction on peak signals. A very wide dynamic range can thus be obtained. The gated stages include junction type transistors and provision is made for clamping these transistors to stable operating potentials in order to maintain the temperature stability.

The speech amplifier is a common emitter type amplifier having its intrinsic gain controlled by varying the emitter current but, since the base bias voltage is made very stiff, the emitter potential does not shift appreciably as the gain is varied.

The invention, both as to its organization and method of operation, together with further objects and advantages thereof, will best be understood by reference to the specification taken in connection with the accompanying drawing in which.

Figure 1:
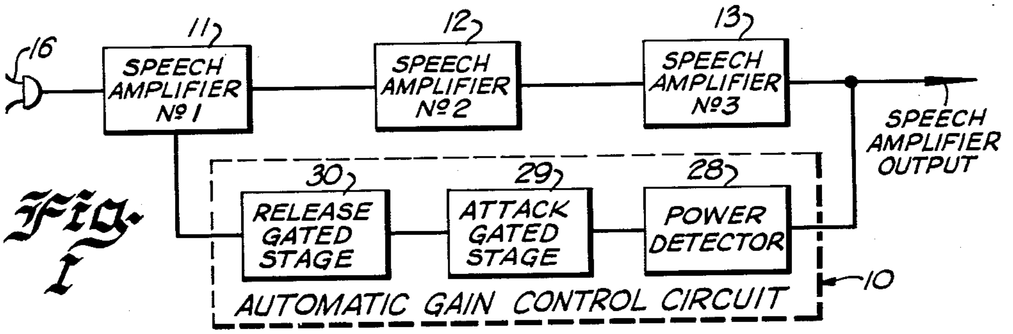
FIG. 1 is a block diagram showing the gain control circuit of the present invention as used in conjunction with a speech amplifier.
Figure 2:
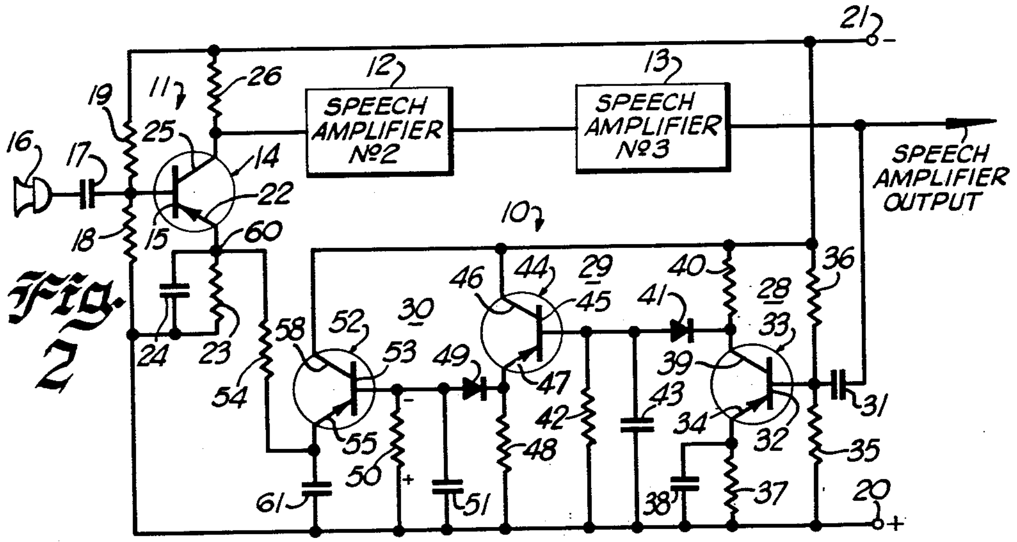
FIG. 2 is a schematic diagram showing several of the stages illustrated in block form in FIG. 1.

Referring now to the drawing and first to FIGS. 1 and 2, the gain control circuit of the present invention is there indicated by reference numeral 10 and is used to control the gain of a typical speech amplifier comprising a plurality of amplifying stages 11, 12 and 13. While three such stages are shown in the drawing, it should be understood that any desired number may be employed depending, of course, upon the desired amplification, the gain of each stage, and other similar factors. Each of the amplifying stages is of the resistance coupled type and is operated Class A with the circuit 10 being illustrated as effective to control the gain of only the first stage 11.

The first stage 11 is illustrated as including a junction type transistor 14 having its base 15 supplied with speech input signals derived from a microphone 16 or the like. The transistor 14 is illustrated as being of the p-n-p type but the gain control circuit of the present invention is also applicable to n-p-n type transistors. These input signals pass through a coupling capacitor 17 and are supplied to the junction between a resistor 18 and a resistor 19 connected in a voltage divider network across the positive and negative terminals 20 and 21 of a D.C. source. The use of the term positive and negative merely indicates relative polarity since the terminal 21 may actually be at zero or ground potential while the terminal 20 is positive or, on the other hand, the terminal 20 may be at ground potential while the terminal 21 is negative. The emitter 22 of the transistor 14 is connected to the positive terminal 20 through a resistor 23 bypassed by a capacitor 24. The collector 25 of the transistor 14 is connected to the negative terminal 21 through a load resistor 26 across which the output of the amplifying stage 11 is developed. This output is, of course, passed through the amplifying stages 12 and 13.

A portion of the output of the amplifying stage 13 is applied to the gain control circuit or loop 10 which includes a power detector stage 28 and a pair of gating circuits 29 and 30 providing widely different time constants for the attack and release of the gain control signal. More specifically, the output of the amplifying stage 13 is coupled through a capacitor 31 to the base 32 of a junction transistor 33 which is again illustrated as being of the p-n-p type although, here again, it might be also of the n-p-n type. The input signals to the latter stage are applied between the emitter 34 and the base 32 of the transistor and are developed across a resistor 35 which is connected in series with a resistor 36 to form a voltage divider network across the terminals 20 and 21. The transistor 33 has its emitter 34 connected to the positive terminal 20 through a resistor 37 bypassed by a condenser 38. The collector 39 is connected to the negative terminal 21 through a load resistor 40 across which the output of the detector 28 is developed. The voltage divider network formed by resistors 35 and 36 biases the base of the transistor 33 to saturation so that even small output signals from the stage 13 are detected.

Assuming that signals are present at the output of the stage 13 and that it is, therefore, desirable to reduce the gain of the stage 11 in order to control these signals, the power detector 28 produces an output signal across the load resistor 40. The output signal developed across the resistor 40 is passed through a diode 41, which passes only negative-going signals, to an RC network consisting of resistor 42 and condenser 43 in the base circuit of a transistor 44 in the attack gated circuit 29. The RC network, which is connected between the base 45 of the latter transistor and the positive terminal 20, serves the dual purpose of providing a fast attack time constant for the AGC circuit 10 and of temperature stabilizing the transistor 44. More specifically, the latter transistor is connected as an emitter follower with its collector 46 connected directly to the negative terminal 21 and its emitter 47 connected through a load resistor 48 to the positive terminal 20. The negative signal passed by the diode 41, of course, charges the condenser 43 very rapidly and drives the base 45 in a negative direction to increase the emitter current flow through resistor 48, thus developing a negative signal at the output of the emitter follower stage. The time constant of the RC network 42—43 is very fast with the result that the signal developed across the resistor 48 follows closely the signal passed by the diode 41 and this, coupled with the fact that the condenser 43 is charged from a low impedance, small time constant circuit with large voltage excursion (across resistor 40), produces the fast attack time of the gain control circuit 10. The negative signal appearing across the resistor 48 is gated through a diode 49 to a second RC network consisting of resistor 50 and condenser 51 connected in the base circuit of a transistor 52 in the release gated stage 30. The low output impedance of the emitter follower including transistor 44 causes the condenser 51 to charge very rapidly through the gating diode 49 to substantially the same voltage as the condenser 43 and at about the same rate. The signal passed by the diode 49 also drives the base 53 of the transistor 52 in a negative direction thereby increasing the flow of emitter current through a resistor 54 connected between the emitter 55 of the transistor 52 and the emitter 22 of the transistor 14 in the first speech amplifier stage 11. The collector 58 of the transistor 52 is connected directly to the negative terminal 21.

Figure 3:
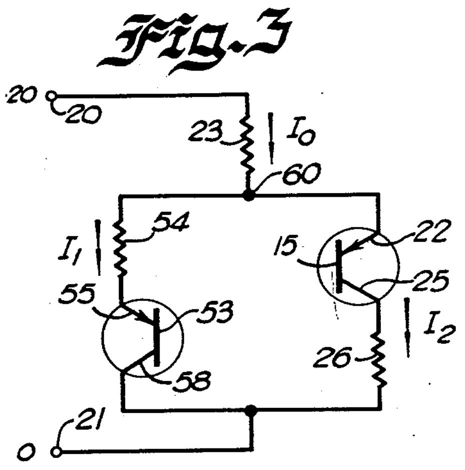
FIG. 3 is a simplified diagram which is useful in explaining the operation of the gain control circuit of the present invention.

The increased emitter current in the transistor 52 results in decrease of the gain of the first amplifying stage 11. As was previously indicated, the bias on the transistor 14 is so stiff that its emitter potential, i.e., the potential of junction 60, remains substantially constant despite variations in emitter current of the transistor 52. This is accomplished by well known means of D.C. stabilization. More specifically, the impedance of the voltage divider network formed by resistors 18 and 19 is selected so that the voltage at the base 15 is substantially equal to the voltage at the emitter 22 and is stiff in order to provide a stable operating point. In this connection, it should be observed that a stable emitter potential establishes stable voltage reference levels throughout the amplifier. The operating point for the transistor 14 is given in terms of its D.C. collector current and the D.C. voltage between its collector and emitter. When the latter voltage exceeds a predetermined level, usually 2 or 3 volts, the intrinsic gain of the transistor is virtually independent of the voltage and becomes primarily a function of the collector current which is, in turn, made up of emitter current and base current. Since the base current is only a small fraction of the collector current, the latter is, for all practical purposes, equal to the emitter current. Therefore, by controlling the level of the emitter current in the transistor 14 it is possible to control the gain. The emitter current is controlled by bleeding off controlled amounts through the resistor 54 and the transistor 52. A simplified circuit of the components used in the gain control is shown in FIG. 3 from which it will be apparent that, since the emitter voltage remains substantially constant, the total current flow $I_0$ through the resistor 23 is also maintained substantially constant. The current $I_0$ is obviously made up of the emitter current $I_2$ of the transistor 14 and the emitter current $I_1$ of the transistor 52. Since the total current $I_0$ remains substantially constant, the increased flow of emitter current $I_1$ through the resistor 54 in response to the signal gated through diode 49 is accompanied by a decrease in the flow of emitter current $I_2$ through the transistor 14, thus decreasing the gain of the amplifying stage 11.

In view of the foregoing description it will be recognized that the peak signals at the output of the amplifier 13 result in the development of a gain control signal which reduces the gain of the stage 11. The fast time constants of the network 42—43 and the accompanying fast charging of the condenser 51 through the diode 49 give a very fast attack time for the circuit. The time constant of the RC network 50—51 is an order of magnitude larger than that of the network 42—43 and, hence, the network 50—51 is effective to maintain increased emitter current flow through the transistor 52 for an interval following the attack instant. The long time constant of the network 50—51, therefore, provides a slow release for the AGC circuit 10. The slow release time, of course, prevents frequent signal bursts through the amplifying stages and, hence, improves the quality of the transmission. An initial burst or overshoot of the gain control, for example, at the beginning of a sentence is unavoidable even with the AGC circuit described. This initial burst is of short duration and since the gain is kept down for a while as a result of the slow release time, bursts are not repeated at a syllabic rate. However, such an initial burst might overload the transmitter and, hence, the output of the speech amplifier from the stage 13 may be passed through a clipper (not shown) designed to clip at or slightly below the overload level. The distortion generated by such a clipper is not offensive because it is of such short duration that it is virtually indiscernible to the human ear.

Figure 4:
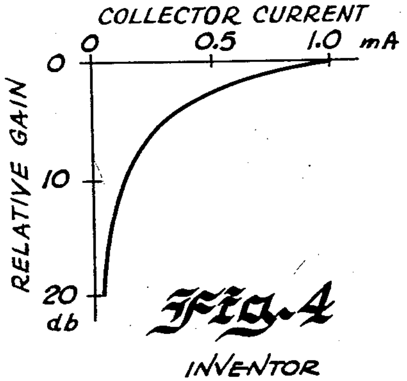
FIG. 4 is a typical curve of collector current versus gain for the speech amplifier shown in FIGS. 1 and 2 and will be useful in explaining the present invention.

A capacitor 61 connected from the emitter 55 to the positive terminal 20 prevents motor-boating of the circuit by filtering any residual A.C. in the control signal at the output of the stage 30. The resistor 54 stabilizes the control current $I_1$ by preventing small changes in the gain control signal from causing large variations in the emitter current flow through transistor 14. Specifically, the curve shown in FIG. 4 of the gain reduction in the amplifying stage 11 versus D.C. collector current of the transistor 14 is very steep at large gain reductions and, as a consequence, the bleed current $I_1$ must be very stable and carefully controlled to obtain an accurate control of the gain. Thus, it is desirable that the existence of a given voltage at the base 53 in response to a signal from the stage 13 of predetermined level will produce a well defined value of bleed current $I_1$. Small variations in the voltage at the base 53 should not be allowed to produce large excursions of the bleed current $I_1$. This is accomplished by the resistor 54 and the negative D.C. feedback in the stage 30. Such an arrangement requires that the control signal at the base 53 have a large voltage and, as a result, the power detector 28 must provide a large voltage output in response to signals from the amplifying stage 13. This accounts for the use of a power detector transistor 33 initially biased to saturation. The need for a large voltage change at the base 53 to effect significant gain reduction in the amplifying stage 11 also means that small, instantaneous variations in the input signal will not cause fluctuations in the gain, thus providing what may be termed a delayed AGC action.

Resistors 42 and 50 are of such value that under no-signal conditions, i.e., in the absence of drive signals from the amplifier 13 to the power detector 28, the diodes 41 and 49 remain conducting throughout the temperature range of the circuit to provide the desired fast attack and slow release time constants without compromising the temperature stability of the transistor circuits. More specifically, as is well known, the cutoff collector current $I_{CO}$ of a transistor includes the thermally generated reverse current flowing through the collector to base junction and the leakage current. The thermally generated current increases exponentially with temperature. It flows through the collector to base junction and, hence, does not directly affect the collector current but, when the voltage divider connected to the base has a high impedance, the current $I_{CO}$ shifts the base voltage and indirectly affects the collector current by varying the base current. At room temperatures the current $I_{CO}$ for most transistors has negligible effect but as the temperature increases, this current becomes bothersome. Therefore, in order to avoid the effects of the current $I_{CO}$, it is important to keep the base circuit impedance as low and the emitter resistance as large as the remaining circuit considerations will permit. This accounts for the desirability of keeping the diodes 41 and 49 conducting under no-signal conditions throughout the temperature range. Thus, if the diodes were cut off under no-signal conditions, the D.C. resistance in the base circuit of the transistor 44 would comprise only the large resistor 42. The current $I_{CO}$ of the transistor 44 flowing into the base 45 would drive the base in a negative direction, thereby decreasing the gain of the amplifying stage 11 even though no input speech signal is present. The same situation would prevail in the transistor 52. By keeping the diodes 41 and 49 conducting, the above disadvantages are avoided and temperature stability of the transistor circuits is thus achieved.

In view of the foregoing discussion, it will be recognized that the gain control circuit described is effective to accomplish the enumerated objects of the invention. This circuit controls the gain of a speech amplifier without increasing the distortion and is, at the same time, capable of providing a control signal having fast attack and slow release time constants without adversely affecting the temperature stability. While a particular embodiment of the invention has been shown, it will be understood, of course, that the invention is not limited thereto since many modifications will occur to those skilled in the art and it is, therefore, contemplated by the appended claims to cover any such modifications as fall within the true spirit and scope of the invention.

What is claimed as new and desired to be secured by Letters Patent of the United States is:

1. In an automatic gain control circuit for a transistor amplifier of the type having an input signal applied to its base and an output signal derived from its collector, a source of D.C. power having positive and negative terminals, means connected to the base of the transistor to bias the amplifier, and the collector being connected to one terminal of said source through a load resistor, a power detector circuit responsive to speech signals derived from the amplifier, a gated circuit excited by the signal output from said power detector circuit and including a diode coupled to pass only signals of one polarity from said power detector, said gated circuit including an emitter-follower transistor circuit having a slow time constant resistor-capacitor network in the base circuit of said emitter-follower transistor, a stabilizing circuit including said diode and the resistance of said slow time constant network coupled across said terminals for maintaining said diode in conducting condition throughout the temperature range of the equipment, a resistor, the transistor of said emitter-follower having an emitter connected through said resistor to the emitter electrode of said amplifier, means including a resistance connected between the other terminal of said D.C. source and the emitter electrode of said amplifier for maintaining substantially constant the total current through the emitter circuits of said amplifier and the emitter-follower for holding the emitter electrode voltage of the amplifier substantially constant irrespective of variations in emitter current flow through the transistor of said emitter-follower, whereby the signal passed by said diode differentially increases and decreases, respectively, the currents flowing in the emitter circuits of said emitter-follower and said amplifier.

2. In an automatic gain control circuit for a transistor amplifier of the type having an input signal applied to its base and an output signal derived from its collector, a source of D.C. power having a voltage divider network connected across its positive and negative terminals, the base of the transistor being connected to the voltage divider network to bias the amplifier, and the collector being connected to one terminal through means including a load resistor, a power detector circuit responsive to speech signals derived from the amplifier and including a transistor biased to yield maximum detection gain, a first gated circuit at the output of the power detector and including a first diode connected to pass only signals of one polarity, said first gated circuit further including a first emitter follower transistor circuit having in its base circuit a fast time constant resistance-capacitor network supplied with signals passed by said first diode, a first stabilizing circuit including said first diode and the resistance of said first network connected between the positive and negative terminals of the source to maintain said first diode conducting throughout the temperature range of operation, a second gated circuit excited by the signal output from the first emitter follower circuit and including a second diode connected to pass only signals of one polarity, said second gated circuit including a second emitter follower transistor circuit having a slow time constant resistor capacitor network in its base circuit, a second stabilizing circuit including said second diode and the resistance of said slow time constant network connected for maintaining the second diode conducting throughout the temperature range of the equipment, the transistor of said second emitter follower having an emitter connected through at least one resistor to the emitter of said amplifier, whereby the signal passed by the second diode increases the emitter current flow through the transistor of the second emitter follower, means including a resistance connected between the other terminal of the D.C. source and the emitter of the amplifier for maintaining the emitter voltage of the amplifier substantially constant irrespective of variations in emitter current flow through the transistor of the second emitter follower so that the latter current flow is effective to decrease the flow of emitter current in the amplifier, and means including a bypass condenser connected to bypass A.C. signals from the emitter of the second emitter follower.

3. In an automatic gain control circuit for a transistor amplifier of the type having an input signal applied to its base and an output signal derived from its collector, means including a source of D.C. power having positive and negative terminals for biasing the base of the transistor in the amplifier, a power detector circuit responsive to speech signals derived from the amplifier and including a transistor biased to yield relatively high detection gain, a first gated circuit at the output of the power detector and including a first diode connected to pass only signals of one polarity, said first gated circuit further including a first emitter follower transistor circuit having in its base circuit a fast time constant resistance-capacitor network supplied with signals passed by said first diode, a first stabilizing circuit including said first diode and the resistance of said first network connected between the positive and negative terminals of the source to maintain the first diode conducting throughout the temperature range of operation, a second gated circuit excited by the signal output from said first emitter follower circuit and including a second diode connected to pass only signals of one polarity, said second gated circuit including a second emitter follower transistor circuit having a slow time constant resistor-capacitor network in its base circuit, a second stabilizing circuit connected to be energized by said source and including the second diode and the resistance of the slow time constant network for maintaining the second diode conducting throughout the temperature range of the equipment, the transistor of said second emitter follower having an emitter connected through at least one resistor to the emitter of said amplifier, whereby the signal passed by the second diode increases the emitter current flow through the transistor of the second emitter follower, and means including a resistance connected between one terminal of the D.C. source and the emitter of the amplifier for maintaining the emitter voltage of the amplifier substantially constant irrespective of variations in emitter current flow through the transistor of the second emitter follower so that the latter current flow is effective to decrease the flow of emitter current in the amplifier.

4. In an automatic gain control circuit for a transistor amplifier of the type having an input signal applied to its base and an output signal derived from its collector, means including a source of D.C. power having positive and negative terminals for biasing the base of the transistor in the amplifier, a power detector circuit responsive to speech signals derived from the amplifier and including a transistor biased to yield maximum detection gain, a first gated circuit at the output of the power detector and including a first diode connected to pass only negative-going signals, said first gated circuit further including a first emitter follower transistor circuit having in its base circuit a fast time constant resistance-capacitor network supplied with signals passed by the diode, a second gated circuit excited by the signal output from said first emitter follower circuit and including a second diode connected to pass only negative-going signals, said second gated circuit including a second emitter follower transistor circuit having a slow time constant resistor-capacitor network in its base circuit, the transistor of said second emitter follower having an emitter connected through at least one resistor to the emitter of the amplifier, whereby the signal passed by the second diode increases the emitter current flow through the transistor of the second emitter follower, and means including a resistance connected between one terminal of the D.C. source and the emitter of the amplifier for maintaining the emitter voltage of the amplifier substantially constant irrespective of variations in emitter current flow through the transistor of the second emitter follower so that the latter current flow is effective to decrease the flow of emitter current in the amplifier.

5. In an automatic gain control circuit for a transistor amplifier of the type having an input signal applied to its base and an output signal derived from its collector, means including a source of D.C. power for biasing the base of the transistor in the amplifier, a power detector circuit responsive to speech signals derived from the amplifier and including a transistor biased to yield maximum detection gain, a first gated circuit at the output of the power detector, said first gated circuit further including a first emitter follower transistor circuit having a fast time constant resistance-capacitor network in its base circuit supplied with signals from the detector, a second gated circuit excited by the signal output from said first emitter follower circuit and including a second emitter follower transistor circuit having a slow time constant resistor-capacitor network in its base circuit, the transistor of said second emitter follower having an emitter connected through at least one resistor to the emitter of the amplifier, whereby the signal passed by the second gated circuit increases the emitter current flow through the transistor of the second emitter follower, and means including a resistance connected between one terminal of the D.C. source and the emitter of the amplifier for maintaining the emitter voltage of the amplifier substantially constant irrespective of variations in emitter current flow through the transistor of the second emitter follower so that the latter current flow is effective to decrease the flow of emitter current in the amplifier.

6. In an automatic gain control circuit for a transistor amplifier of the type having a control electrode, an input signal applied to an input electrode and an output signal derived from an output electrode, a source of D.C. power having a voltage divider network connected across its positive and negative terminals, the input electrode of the transistor being connected to the voltage divider network to bias the amplifier and the output electrode being connected to one terminal through means including a load resistor, a power detector circuit responsive to speech signals derived from the amplifier and including a transistor biased to yield relatively high detection gain, a first gated circuit at the output of the power detector and including a first diode connected to pass only signals of one polarity, said first gated circuit further including a first emitter follower transistor circuit having in its base circuit a fast time constant resistance-capacitor network supplied with signals passed by said first diode, a first circuit including said first diode and the resistance of said first network connected between the positive and negative terminals of the source to maintain the first diode conducting throughout the temperature range of operation, a second gated circuit excited by the signal output from said first emitter follower circuit and including a second diode connected to pass only signals of one polarity, said second gated circuit including a second emitter follower transistor circuit having a slow time constant resistor-capacitor network in its base circuit, a second circuit connected between the positive and negative terminals of the source and including the second diode and the resistance of the slow time constant network for maintaining the second diode conducting throughout the temperature range of operation, the transistor of said second emitter follower having an emitter connected through at least one resistor to the control electrode of the transistor in the amplifier, whereby the signal passed by the second diode increases the emitter current flow through the transistor of the second emitter follower, and means including a resistance connected between one terminal of the D.C. source and the control electrode of the amplifier for maintaining the control electrode potential of the amplifier substantially constant irrespective of variations in emitter current flow through the transistor of the second emitter follower so that the latter current flow is effective to decrease the flow of current through the control electrode in the amplifier, and means including a bypass condenser connected to bypass A.C. signals from the emitter of the second emitter follower.

7. In an automatic gain control circuit for a transistor amplifier of the type having a control electrode, an input signal applied to an input electrode and an output signal derived from an output electrode, means including a source of D.C. power for biasing the input electrode, a power detector circuit responsive to speech signals derived from the amplifier and including a transistor biased to yield maximum detection gain, a first gated circuit at the output of the power detector and including a first diode connected to pass only negative-going signals, said first gated circuit further including a first emitter follower transistor circuit having in its base circuit a fast time constant resistance-capacitor network supplied with signals passed by said first diode, a first circuit including said first diode and the resistance of said first network connected between the positive and negative terminals of the source to maintain the first diode conducting through the temperature range of the equipment, a second gated circuit excited by the signal output from said first emitter follower circiut and including a second diode connected to pass only signals of one polarity, said second gated circuit including a second emitter follower transistor circuit having a slow time constant resistor-capacitor network in its base circuit, a second circuit connected between the positive and negative terminals of the source and including the second diode and the resistance of the slow time constant network for maintaining the second diode conducting throughout the temperature range of operation, the transistor of said second emitter follower having an emitter connected through at least one resistor to the control electrode of the amplifier, whereby the signal passed by the second diode increases the emitter current flow through the transistor of the second emitter follower, and means including a resistance connected between one terminal of the D.C. source and said control electrode of the amplifier for maintaining the control electrode voltage of the amplifier substantially constant irrespective of variations in emitter current flow through the transistor of the second emitter follower so that the latter current flow is effective to decrease the flow of control electrode current in the amplifier.

References Cited in the file of this patent

UNITED STATES PATENTS

| | | |
|---|---|---|
| 2,489,126 | Fay et al. | Nov. 22, 1949 |
| 2,673,899 | Montgomery | Mar. 30, 1954 |
| 2,773,945 | Theriault | Dec. 11, 1956 |
| 2,862,046 | Relis | Nov. 25, 1958 |
| 2,866,015 | Sailor | Dec. 23, 1958 |